United States Patent
Chen

(10) Patent No.: US 7,538,421 B2
(45) Date of Patent: May 26, 2009

(54) FLIP-CHIP PACKAGE STRUCTURE WITH STIFFENER

(75) Inventor: Jau-Shoung Chen, Hsinchu County (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 21 days.

(21) Appl. No.: 11/562,970

(22) Filed: Nov. 22, 2006

(65) Prior Publication Data

US 2008/0001308 A1   Jan. 3, 2008

(30) Foreign Application Priority Data

Jun. 30, 2006   (TW) ............... 95124049 A

(51) Int. Cl.
*H01L 23/13* (2006.01)
(52) U.S. Cl. .............. 257/704; 257/778; 257/730
(58) Field of Classification Search .......... 257/685, 257/686, 730, 704, 778
See application file for complete search history.

(56) References Cited

U.S. PATENT DOCUMENTS

| | | | | |
|---|---|---|---|---|
| 6,002,171 A | * | 12/1999 | Desai et al. ............ | 257/707 |
| 6,313,521 B1 | * | 11/2001 | Baba ...................... | 257/678 |
| 2002/0053449 A1 | * | 5/2002 | Carden et al. .......... | 174/52.1 |
| 2004/0080037 A1 | * | 4/2004 | Foong et al. ........... | 257/687 |
| 2005/0161816 A1 | | 7/2005 | Kanda | |
| 2006/0261467 A1 | * | 11/2006 | Colgan et al. .......... | 257/707 |
| 2007/0069366 A1 | * | 3/2007 | Chang et al. ........... | 257/700 |
| 2007/0145571 A1 | * | 6/2007 | Lee et al. ............... | 257/706 |
| 2007/0194464 A1 | * | 8/2007 | Fukuzono ............... | 257/791 |

* cited by examiner

*Primary Examiner*—David Vu
*Assistant Examiner*—Earl N Taylor
(74) *Attorney, Agent, or Firm*—Winston Hsu

(57) ABSTRACT

A flip-chip package structure with stiffener includes a substrate, a first stiffener positioned on a surface of the substrate, a chip having a plurality of bumps adopted to electrically connect the substrate and the chip, and a second stiffener positioned on the surface of the substrate and connected with the first stiffener. The first stiffener is positioned outside of the second stiffener.

7 Claims, 5 Drawing Sheets

FLIP-CHIP PACKAGE STRUCTURE WITH STIFFENER

BACKGROUND OF THE INVENTION

1. Field of the Invention

The invention relates to a flip-chip package structure and a method for manufacturing the same, and more particularly, to a flip-chip package structure with stiffeners and a method for manufacturing the same.

2. Description of the Prior Art

Following the ever-present demand for decreasing the sizes and geometries of electronic components, the high-speed requirement and miniaturization in IC packaging technology are continually rising and become a principal objective of the IC packaging technology.

The flip-chip package structure is therefore developed. Being different from traditional wire bonding packages, chips used in the flip chip package are inverted upside down on a substrate with solder bumps to provide electrical connection between the flip chip and the substrate. Thus the scales and the sizes of the package structures are efficiently decreased while its operation for high-speed signals and heat dissipation are still improved.

For improving performance of package structures in order to satisfy demand for processing huge signals, a flip-chip package structure needs to accommodate more semiconductor chips, or to enlarge the size of the chip for containing more electric devices. However, due to the different coefficients of thermal expansion (CTE) between the chip and the substrate, the large-scaled flip-chip package structure is apt to bend during thermal treatment processes such as reflow process or curing process, and accordingly the coplanarity of the flip-chip package structure is adversely effected. In addition, such problem is not easily controlled during manufacturing process, especially in the manufacturing process of the flip-chip package structure. Therefore the problem of unfavorable coplanarity of the large-scaled flip-chip package structure is a problem that is in need of an immediate solution.

Please refer to FIG. 1, which is a schematic drawing of a conventional flip-chip package structure. The flip-chip package structure comprises a substrate 30, a chip 40 having a plurality of solder bumps 50 for electrically connecting the chip 40 to the substrate 30, and a stiffener 20 positioned on a surface of the substrate 30. The flip-chip package structure also comprises an under-fill 70 formed in between the substrate 30 and the chip 40 and encapsulating the solder bumps 50, and a lid 10 positioned on the stiffener 20 and the chip 40. The lid 10 can be a heat slug. The stiffener 20 is ring-shaped and positioned in the periphery of the chip 40.

Please refer to FIG. 2, which is a flow chart of a conventional method for manufacturing a flip-chip package structure. The method comprises:

Step S200: providing a substrate 30.

Step S210: providing a chip 40 having a plurality of solder bumps 50, and positioning the solder bumps 50 on the substrate 30. The solder bumps 50 electrically connect the chip 40 to the substrate 30.

Step S220: providing a stiffener 20 on a surface of the substrate 30.

Step S230: dispensing an under-fill 70 in between the substrate 30 and the chip 40. The under-fill 70 encapsulates the solder bumps 50.

Step S240: providing a lid 10 on the stiffener 20 and the chip 40. The stiffener is ring-shaped and positioned in the periphery of the chip 40.

It is noteworthy that in the conventional manufacturing process of the flip-chip package structure, the chip and substrate is electrically connected by the solder bumps, then the stiffener is positioned on the substrate with the underfill dispensing afterwards. Such processes improve the cleaning effect of the flux but still suffers from substrate bending after positioning the chip on the substrate. In other words, designing and positioning of the stiffener in the conventional manufacturing process of the flip-chip package structure still has an unsolved problem: it can not simultaneously improve the coplanarity of the flip-chip package structure and the cleaning effect of the flux, which is contributive to make the underfill completely contact with the solder bumps, the chip, and the substrate in order to protect the chip.

SUMMARY OF THE INVENTION

It is therefore an objective of the present invention to provide a flip-chip package structure with stiffener and a manufacturing method for the same to solve the abovementioned problem.

The flip-chip package structure with stiffener of the present invention comprises a substrate, a first stiffener positioned on a surface of the substrate, a chip having a plurality of solder bumps for electrically connecting the chip to the substrate, and a second stiffener positioned on the surface of the substrate and connected with the first stiffener. The first stiffener is positioned outside of the second stiffener.

The method for manufacturing the flip-chip package with stiffener of the present invention comprises providing a substrate, providing a first stiffener on a surface of the substrate, providing a chip having a plurality of solder bumps, and positioning the solder bumps on the substrate to provide electrical connection between the chip and the substrate. The electrical connection between the solder bumps and the substrate can be achieved by a reflow process. The reflow process comprises providing welding material, such as flux, on surfaces of the solder bumps, then reflowing the solder bumps and the welding material for electrically connecting the chip to the substrate, and then performing a welding material cleaning process to remove the flux. The method for manufacturing the flip-chip package with stiffener further comprises performing an underfill dispensing process and providing a second stiffener positioned on the surface of the substrate and connected with the first stiffener. The first stiffener is positioned outside of the second stiffener.

According to the flip-chip package structure with stiffener and the method for manufacturing the same, a simple flip-chip package structure and a method are provided. Since the first stiffener is positioned on the substrate before connecting the chip to the substrate, the coplanarity of the flip-chip package structure during reflow is improved and, at the same time, the cleaning effect of the flux is kept good. Therefore the underfill can completely contact with the solder bumps and the substrate during the underfill dispensing process, and thus improves the package structure. The two-stage positioned second stiffener further improves the coplanarity of the flip-chip package structure.

Therefore the problems in the conventional manufacturing method are solved and the coplanarity of the flip-chip package structure is efficiently improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
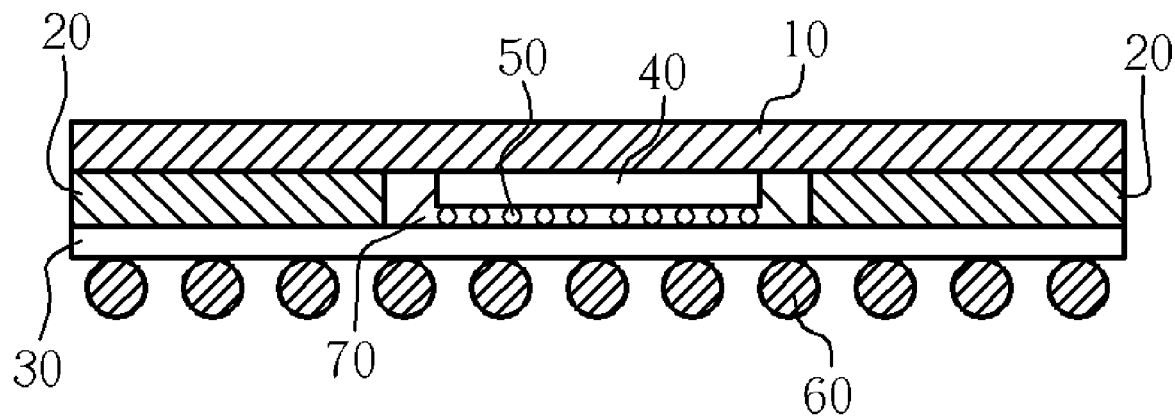
FIG. 1 is a schematic drawing of a conventional flip-chip package structure.
Figure 2:
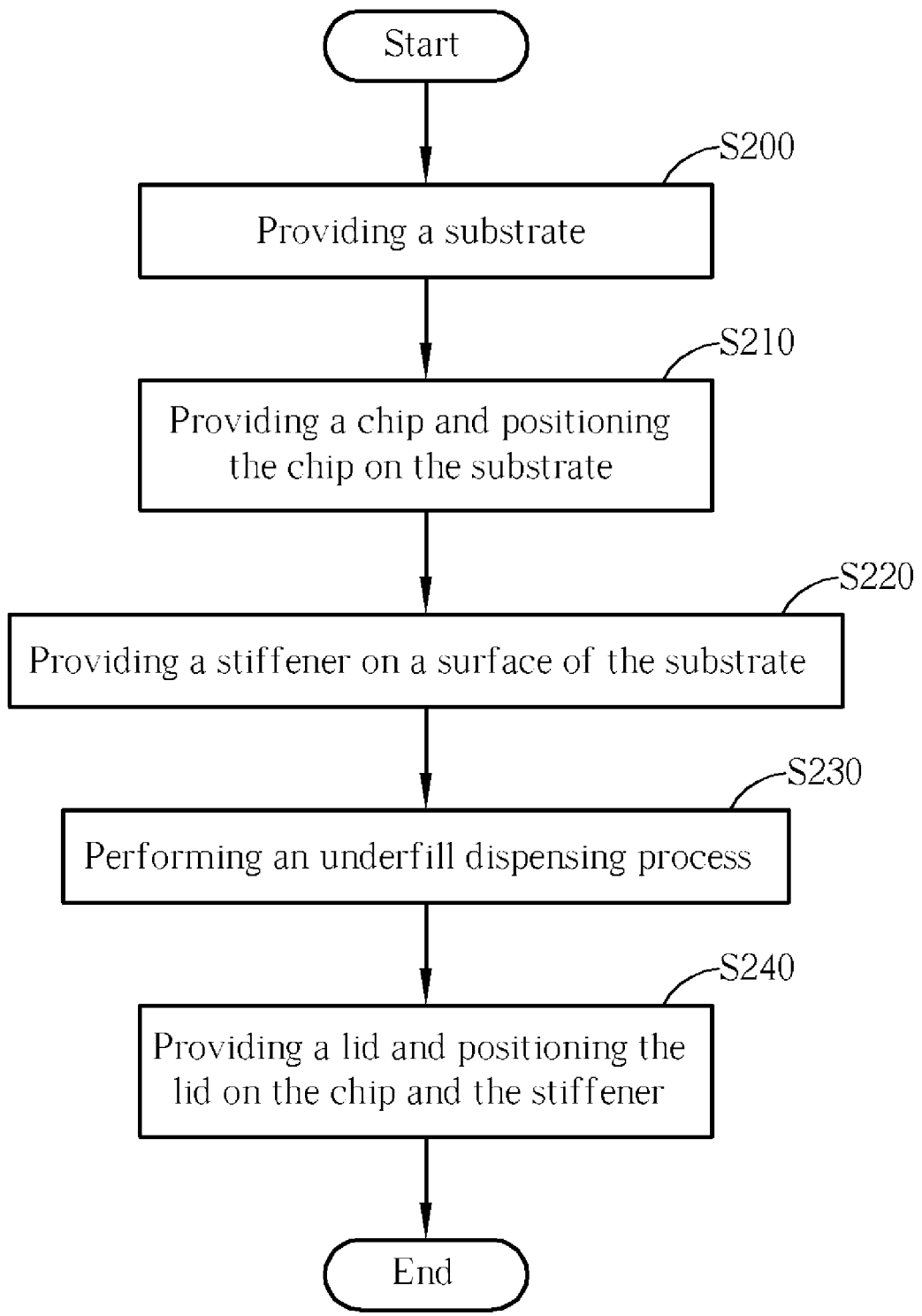
FIG. 2 is a flow chart of a conventional method for manufacturing a flip-chip package structure.
Figure 3:
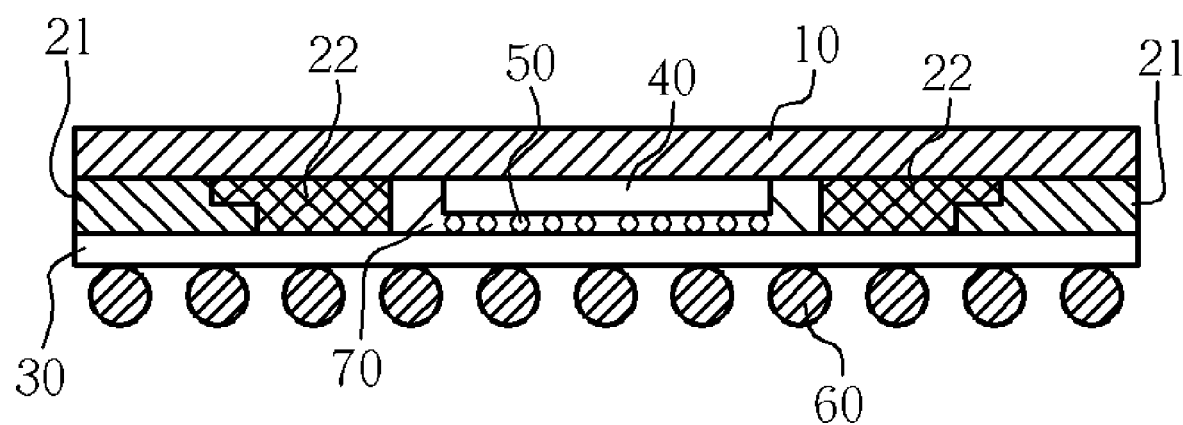
FIG. 3 is a schematic drawing of a flip-chip package structure provided by the present invention.

Please refer to FIG. 3, which is a schematic drawing of a flip-chip package structure provided by the present invention. The flip-chip package structure comprises a substrate 30, such as a circuit board, a first stiffener 21, which has an upper surface and a bottom surface larger than the upper surface, positioned on a surface of the substrate 30 with its bottom surface, a plurality of solder bumps 50, such as solder balls, for electrically connecting a chip 40 to the substrate 30, and an underfill 70 formed in between the substrate 30 and the chip 40 and encapsulating the solder bumps 50.

The flip-chip package structure provided by the present invention also comprises a second stiffener 22 positioned on the surface of the substrate 30 and connected with the first stiffener 21. The first stiffener 21 is positioned outside of the second stiffener 22. The first stiffener 21 and the second stiffener 22 can be ring-shaped. Junction parts of the first stiffener 21 and the second stiffener 22 can be step-shaped, which makes the first stiffener 21 and the second stiffener 22 connect tightly. Additionally, the junction parts of the first stiffener 21 and the second stiffener 22 can also be recess-shaped, zigzag-shaped, or mesh-shaped, depending on the requirements for the different package structures.

The flip-chip package structure provided by the present invention also comprises a lid 10 positioned on the first stiffener 21, the chip 40, and the second stiffener 22. The lid 10 can be used as a heat slug. The flip-chip package structure provided by the present invention further comprises a plurality of solder balls 60 positioned on a backside of the substrate 30 for being electrical connection terminals to an outside circuit.

Figure 4:
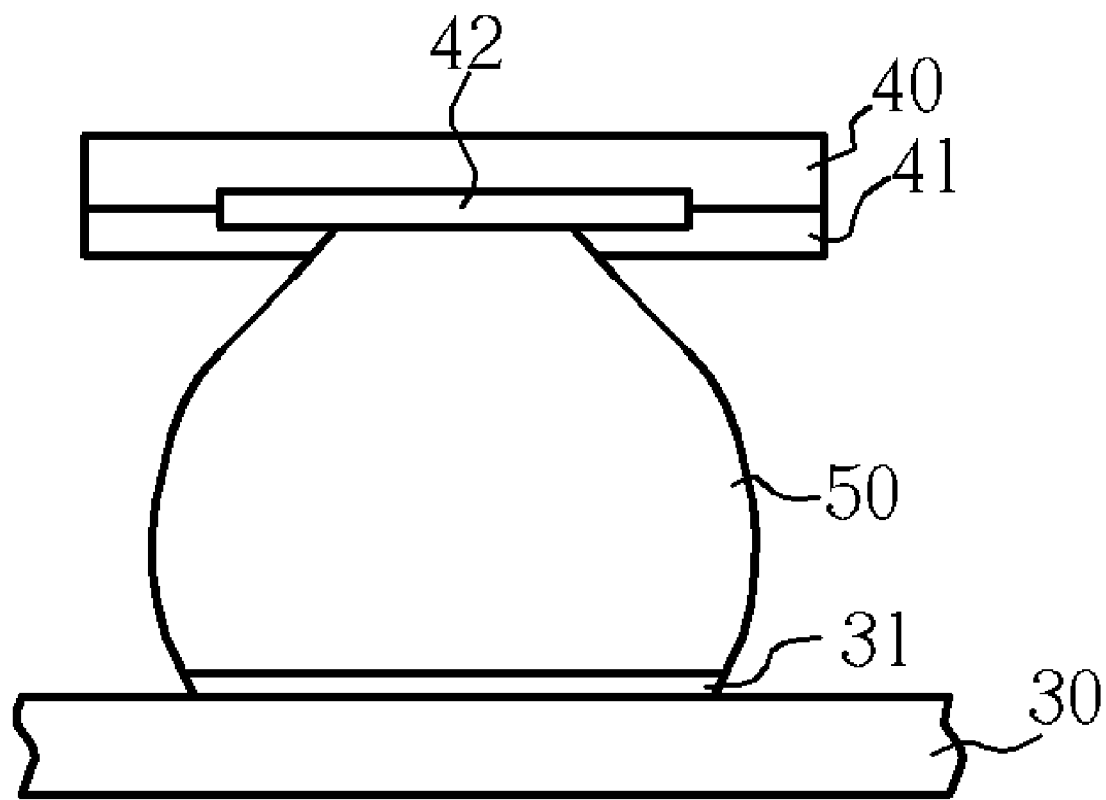
FIG. 4 is a schematic drawing of the solder bumps.

Please refer to FIG. 4, which is a schematic drawing of the solder bumps. As shown in FIG. 4, the solder bumps 50 are used to electrically connect the chip 40 to the substrate 30. The substrate 30 further comprises bonding pads 31 being electrical connection terminals between the substrate 30 and the chip 40; while the chip 40 comprises corresponding metal bonding pads 42 being electrical connection terminals between the chip 40 and the substrate 30. In addition, the chip 40 comprises a chip protecting layer 41 to protect the surface of the chip 40.

Figure 5:
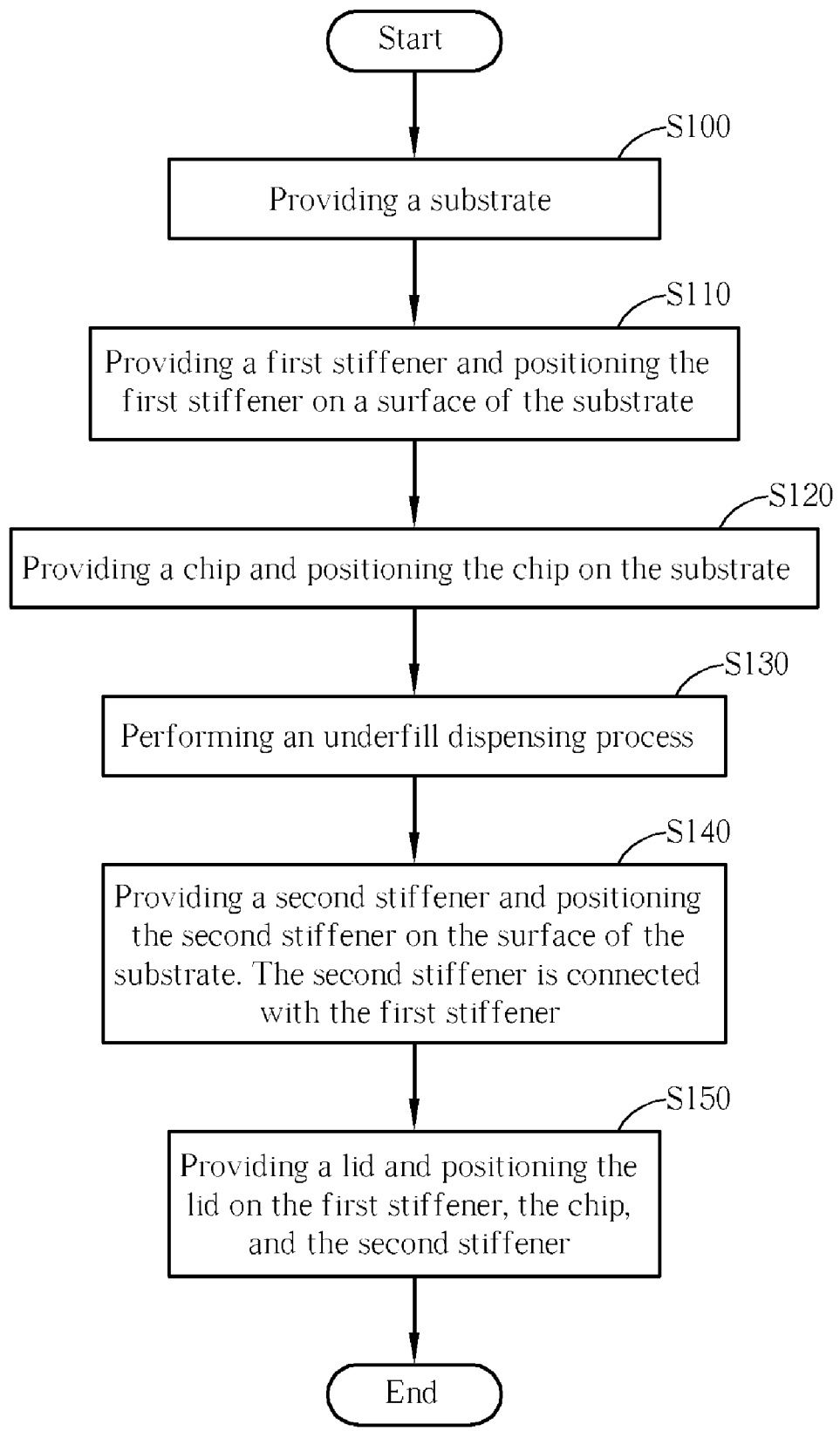
FIG. 5 is a flow chart according to the method for manufacturing the flip-chip package structure with stiffener provided by the present invention.

Please refer to FIG. 5, which is a flow chart according to the method for manufacturing the flip-chip package structure with stiffener provided by the present invention. As shown in FIG. 5, the method comprises:

Step S100: providing a substrate 30.

Step S110: providing a first stiffener 21 on a surface of the substrate 30. The first stiffener 21 comprises an upper surface and a bottom surface and is positioned on the substrate 30 with the bottom surface, which is larger than the upper surface in order to increase the strength of the substrate 30 and prevent the substrate 30 from bending while connecting a chip to the substrate 30.

Step S120: providing a chip 40 comprising a plurality of solder bumps 50, and positioning the solder bumps 50 on the substrate 30 to provide electrical connection between the chip 40 and the substrate 30. The electrical connection between the solder bumps 50 and the substrate 30 can be achieved by a reflow process. The reflow process comprises steps of providing welding material on surfaces of the solder bumps 50, reflowing the solder bumps 50 and the welding material to cure the welding material which comprises flux, and cleaning the welding material to remove the flux after the chip 40 is electrically connected to the substrate 30. Therefore an underfill 70 can completely contact with the solder bumps 50 and the substrate 30 and obtain a better package structure.

Step S130: performing an underfill dispensing process with the underfill 70 dispensed in between the substrate 30 and the chip 40 and encapsulating the solder bumps 50.

Step S140: providing a second stiffener 22 on the surface of the substrate 30. The second stiffener 22 and the first stiffener 21 are connected with each other, and the first stiffener 21 is positioned outside of the second stiffener 22.

Step S150: providing a lid 10 on the first stiffener 21, the chip 40, and the second stiffener 22. The lid 10 can be a heat slug.

As mentioned above, the present invention herein provides a simple flip-chip package structure with stiffener and method for manufacturing the same to improve the coplanarity of the flip-chip package structure and simultaneously to keep the good cleaning effect of the flux, which makes the underfill completely contact with the solder bumps and the substrate, and obtain an improved flip-chip package structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip-chip package structure with stiffener comprising:
a substrate;
a first stiffener having an upper surface and a bottom surface larger than the upper surface positioned on a surface of the substrate, and the first stiffener being positioned on the substrate with the bottom surface; a chip having a plurality of solder bumps for electrically connecting the chip to the substrate; and
a second stiffener positioned on the surface of the substrate and connecting with the first stiffener;
wherein the first stiffener is positioned outside of the second stiffener, and the first stiffener, the second stiffener and the chip are co-planar.

2. The flip-chip package structure of claim 1, wherein a junction part of the first stiffener and the second stiffener is step-shaped which makes the first stiffener and the second stiffener connect tightly.

3. The flip-chip package structure of claim 1 further comprising a lid positioned on the first stiffener, the chip, and the second stiffener.

4. The flip-chip package structure of claim 3, wherein the lid is a heat slug.

5. The flip-chip package structure of claim 1, wherein the substrate is a circuit board.

6. The flip-chip package structure of claim 1 further comprising an underfill formed in between the substrate and chip and encapsulating the solder bumps.

7. The flip-chip package structure of claim 1, wherein the first stiffener and the second stiffener are ring-shaped.

* * * * *